(12) United States Patent
Zuo et al.

(10) Patent No.: US 11,729,954 B2
(45) Date of Patent: Aug. 15, 2023

(54) PROVIDING CONTINUOUS COOLING TO A STORAGE RACK

(71) Applicant: Dell Products L.P., Round Rock, TX (US)

(72) Inventors: Weidong Zuo, Shrewsbury, MA (US); Yuan Chen, Shanghai (CN); Gemma Hui Chen, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 296 days.

(21) Appl. No.: 17/235,481

(22) Filed: Apr. 20, 2021

(65) Prior Publication Data
US 2022/0338389 A1    Oct. 20, 2022

(51) Int. Cl.
*H05K 7/20* (2006.01)
*G06F 1/20* (2006.01)
*G05B 19/4155* (2006.01)

(52) U.S. Cl.
CPC ..... *H05K 7/20836* (2013.01); *G05B 19/4155* (2013.01); *G06F 1/20* (2013.01); *H05K 7/20763* (2013.01); *G05B 2219/50333* (2013.01)

(58) Field of Classification Search
CPC .......... H05K 7/20836; H05K 7/20763; H05K 7/20781; G05B 19/4155; G05B 2219/50333; G05B 19/418; G05B 2219/31268; G05B 2219/45006; G06F 1/20; G06F 2200/201
See application file for complete search history.

(56) References Cited

U.S. PATENT DOCUMENTS

| | | | |
|---|---|---|---|
| 2012/0120603 A1* | 5/2012 | Campbell | G06F 1/20 361/698 |
| 2016/0120059 A1* | 4/2016 | Shedd | F28D 21/00 165/244 |
| 2021/0378149 A1* | 12/2021 | Gao | H05K 7/20736 |

* cited by examiner

*Primary Examiner* — Chad G Erdman
(74) *Attorney, Agent, or Firm* — McDermott Will & Emery LLP

(57) ABSTRACT

A system for providing continuous cooling to a storage rack, including a storage rack, including a first storage node and a second storage node; a first cooling loop including a first cooling distribution unit (CDU); a second cooling loop including a second cooling distribution unit (CDU); a first inlet switching valve coupled between the first storage node and each of the first and the second CDUs; a second inlet switching valve coupled between the second storage node and each of the first and the second CDUs; wherein, when the first cooling loop experiences a failure, a state of the first inlet switch and a state of the second inlet switch is adjusted to i) prevent the first CDU from providing cooling of the first storage node and the second storage node, ii) allow only the second CDU to provide cooling of the first storage node and the second storage node.

20 Claims, 3 Drawing Sheets

PROVIDING CONTINUOUS COOLING TO A STORAGE RACK

BACKGROUND

Field of the Disclosure

The disclosure relates generally to providing continuous cooling to a storage rack.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In utilizing a liquid cooling solution for storage/server products, there is a risk for coolant leakage which may cause whole rack shutdown, resulting in data loss or data unavailability (DL, DU). Avoiding DL/DU and achieving high availability (HA) is the highest priority for storage, which requires the rack-level system to survive any single point failure/service without shutdown of the whole rack.

SUMMARY

Innovative aspects of the subject matter described in this specification may be embodied in a system for providing continuous cooling to a storage rack, including a storage rack, including a first storage node and a second storage node; a first cooling loop including a first cooling distribution unit (CDU); a second cooling loop including a second cooling distribution unit (CDU); a first inlet switching valve coupled between the first storage node and each of the first and the second CDUs; and a second inlet switching valve coupled between the second storage node and each of the first and the second CDUs; wherein, when the first cooling loop experiences a failure, a state of the first inlet switch and a state of the second inlet switch is adjusted to i) prevent the first CDU from providing cooling of the first storage node and the second storage node and ii) allow only the second CDU to provide cooling of the first storage node and the second storage node.

Other embodiments of these aspects include corresponding methods, apparatus, and computer programs, configured to perform the actions of the methods, encoded on computer storage devices. These and other embodiments may each optionally include one or more of the following features. For instance, when the first cooling loop is nominal, the state of the first inlet switch and the state of the second inlet switch allows the first CDU and the second CDU to provide cooling of the first storage node and the second storage node. Each of the first CDU and the second CDU provide 50% of the cooling of each of the first and the second storage nodes. When the first cooling loop is nominal, the state of the first inlet switch and the state of the second inlet switch allows only the first CDU to provide cooling of the first storage node and the second storage node. The first cooling loop further includes a first outlet switching valve coupled between the first storage node and each of the first and the second CDUs; and a second outlet switching valve coupled between the second storage node and each of the first and the second CDUs; wherein, when the first cooling loop experiences the failure, a state of the first outlet switch and a state of the second outlet switch is adjusted to i) further prevent the first CDU from providing cooling of the first storage node and the second storage node and ii) allow only the second CDU to provide cooling of the first storage node and the second storage node. The first cooling loop further includes a first inlet manifold coupled between the first CDU and each of the first and second inlet switching valves, and further includes a first outlet manifold coupled between the first CDU and each of the first and second outlet switching valves. The second cooling loop further includes a second inlet manifold coupled between the second CDU and each of the third and fourth inlet switching valves, and further includes a second outlet manifold coupled between the second CDU and each of the third and fourth outlet switching valves.

Particular implementations of the subject matter described in this specification can be implemented so as to realize one or more of the following advantages. For example, redundant converged liquid loops at rack level with directional switching mechanisms can achieve high availability (HA) for storage/server products in any single point failure/service in the liquid loops without the need for whole rack shut down. Further, redundant converged liquid loops at rack level with directional switching mechanisms can provide continuous 100% cooling capacity for all storage nodes when one loop is shut off by failure. Further, the failure can be isolated to provide 100% cooling capacity to all healthy storage nodes.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
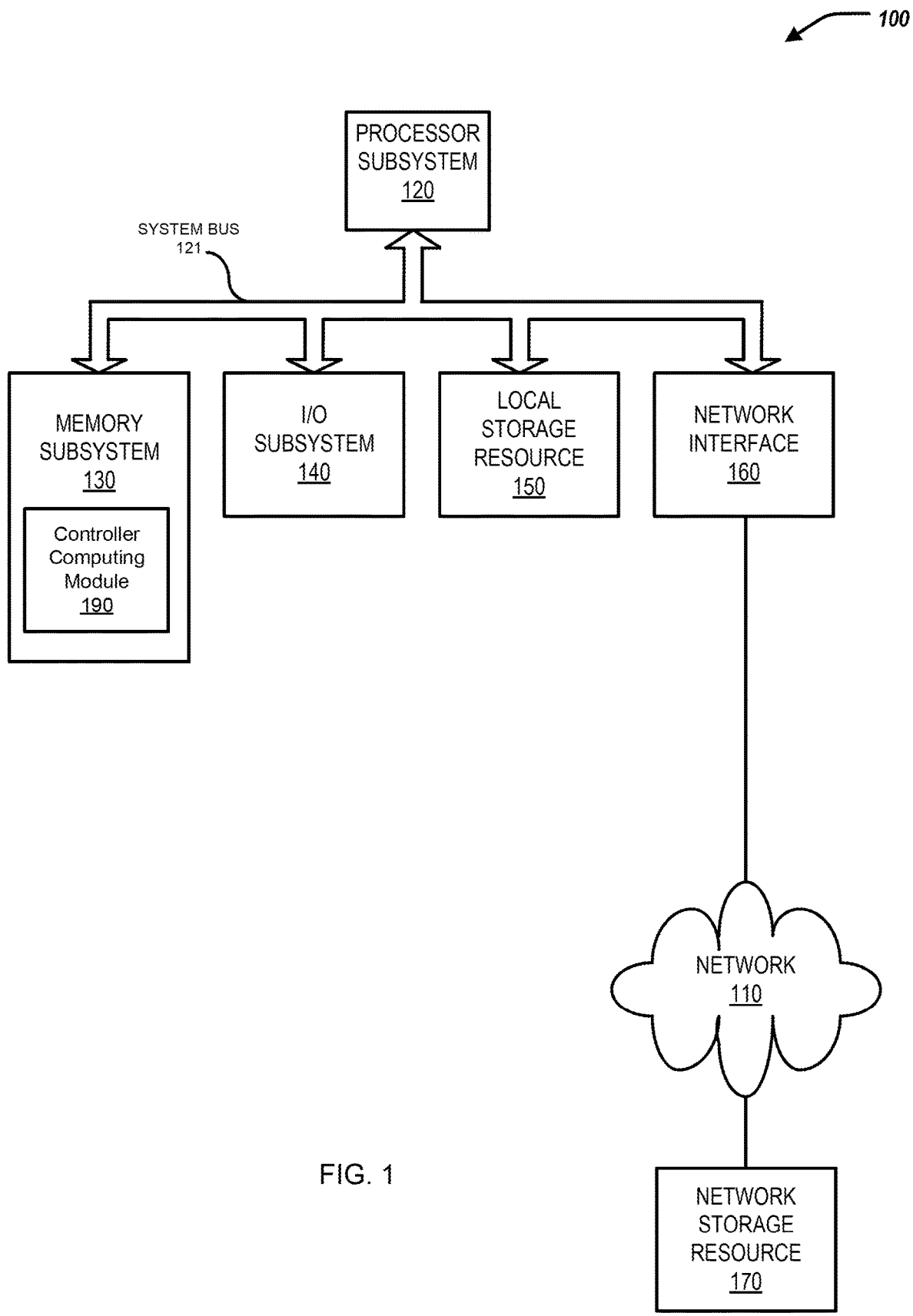
FIG. 1 is a block diagram of selected elements of an embodiment of an information handling system.

This disclosure discusses methods and systems for providing continuous cooling to a storage rack. In short, redundant converged liquid loops can provide 100% cooling capacity of storage nodes when one of the loops is shut off due to failure. Furthermore, one of the storage nodes can be isolated when a failure is detected at the storage node, while providing 100% cooling capacity to the remaining storage nodes.

Specifically, this disclosure discusses a system for providing continuous cooling to a storage rack, including a storage rack, including a first storage node and a second storage node; a first cooling loop including a first cooling distribution unit (CDU); a second cooling loop including a second cooling distribution unit (CDU); a first inlet switching valve coupled between the first storage node and each of the first and the second CDUs; and a second inlet switching valve coupled between the second storage node and each of the first and the second CDUs; wherein, when the first cooling loop experiences a failure, a state of the first inlet switch and a state of the second inlet switch is adjusted to i) prevent the first CDU from providing cooling of the first storage node and the second storage node and ii) allow only the second CDU to provide cooling of the first storage node and the second storage node.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 2:
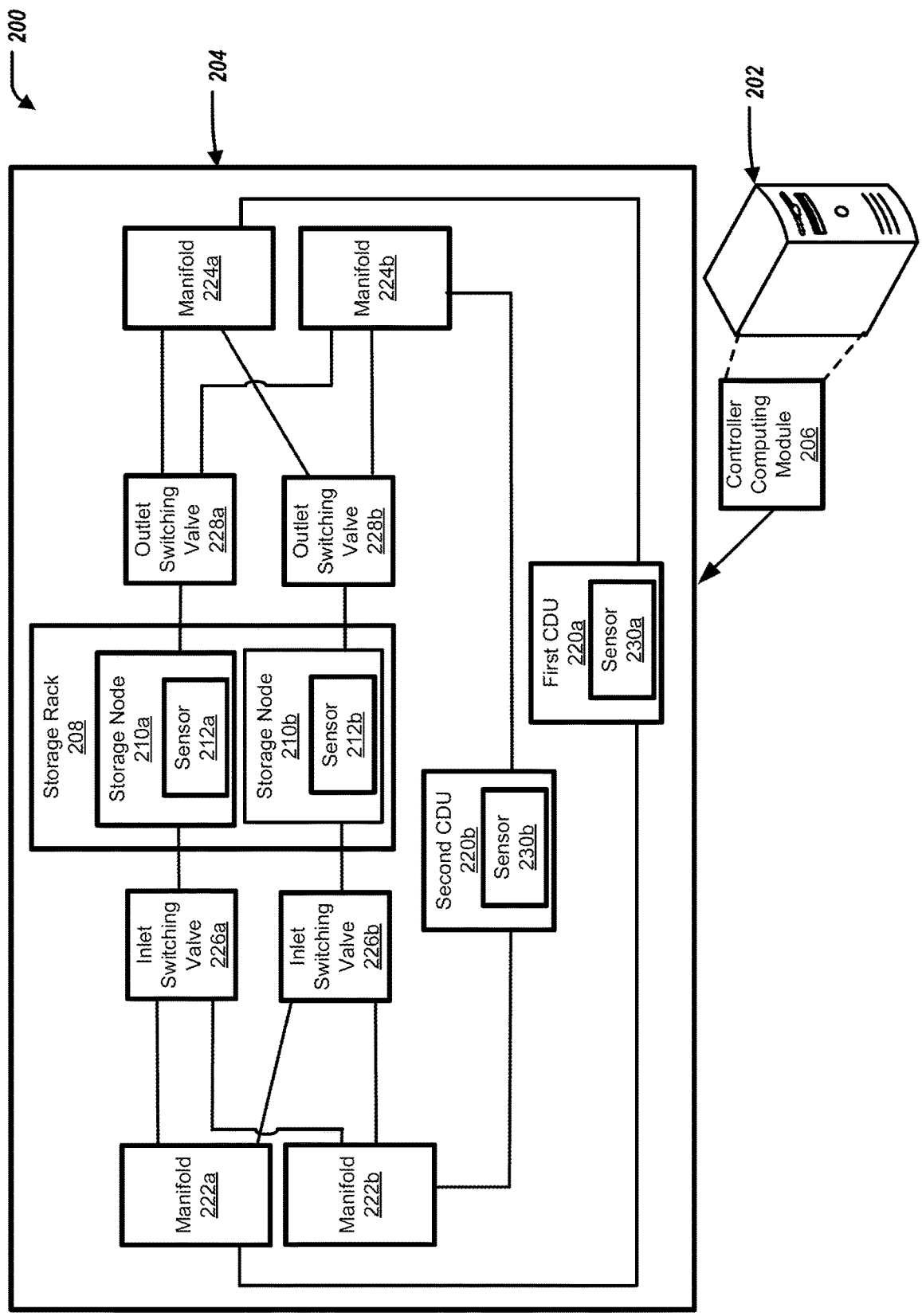
FIG. 2 illustrates a block diagram of an environment for providing continuous cooling to a storage rack.
Figure 3:
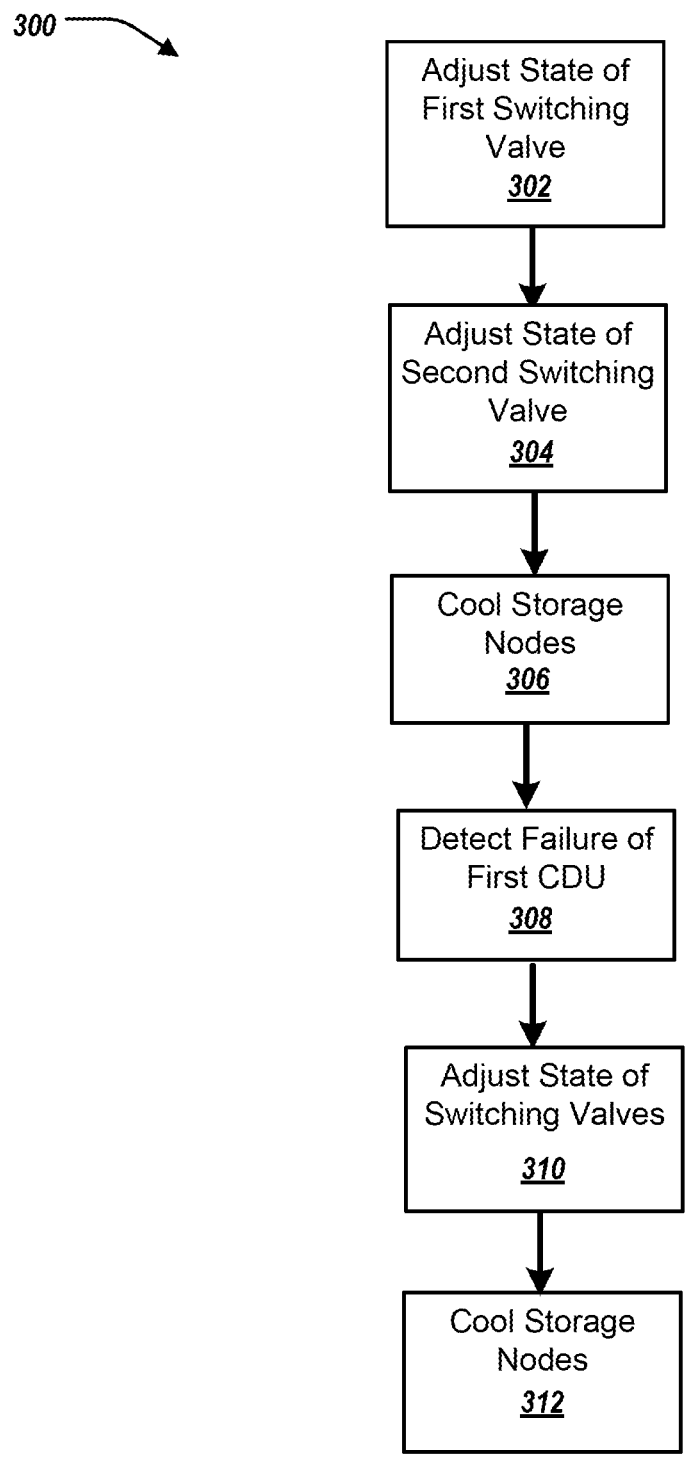
FIG. 3 illustrates a method for providing continuous cooling to a storage rack.

Particular embodiments are best understood by reference to FIGS. 1-3 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a controller computing module 190. The controller computing module 190 can be included by the memory subsystem 130. The controller computing module 190 can include a computer-executable program (software). The controller computing module 190 can be executed by the processor subsystem 120.

Turning to FIG. 2, FIG. 2 illustrates an environment 200 including an information handling system 202 and a storage system 204. The information handling system 202 can include a controller computing module 206. In some examples, the information handling system 202 is similar to, or includes, the information handling system 100 of FIG. 1. In some examples, the controller computing module 206 is the same, or substantially the same, as the controller computing module 190 of FIG. 1.

The storage system 204 can include a storage rack 208. The storage rack 208 can include a first storage node 210a and a second storage node 210b (collectively referred to as storage nodes 210). The storage rack 208 can include any number of storage nodes 210 depending on the application desired. The first storage node 210a can include a sensor 212a, and the second storage node 210b can include a sensor 212b (collectively referred to as sensors 212). The sensors 212 can detect failure of cooling at the associated storage node 210. The sensors 212 can be in communication with the controller computing module 206.

The storage system 204 can include a first and a second cooling loop (two converged coolant loops); however, the storage system 204 can include any number of cooling loops desired depending on the application. In short, each of the cooling loops can provide cooling to the storage nodes 210, providing redundant liquid support. Specifically, the first cooling loop can include a first cooling distribution unit (CDU) 220a, a first inlet manifold 222a, a first outlet manifold 224a, a first inlet switching valve 226a, and a first outlet switching valve 228a. The second cooling loop can include a second cooling distribution unit (CDU) 220b, a second inlet manifold 222b, a second outlet manifold 224b, a second inlet switching valve 226a, and a second outlet switching valve 228b.

In short, the cooling loops can be redundant converged liquid loops that can provide 100% cooling capacity of the storage nodes 210 when one of the loops is shut off due to failure. Furthermore, one of the storage nodes 210 can be isolated when a failure is detected at the storage node 210, while providing 100% cooling capacity to the other storage node 210.

The first CDU 220a and the second CDU 220b can collectively be referred to as CDUs 220. The first inlet manifold 222a and the second inlet manifold 222b can collectively be referred to as inlet manifolds 222. The first outlet manifold 224a and the second outlet manifold 224b can collectively be referred to as outlet manifolds 224. The first inlet switching valve 226a and the second inlet switching valve 226b can collectively be referred to as inlet switching valves 226. The first outlet switching valve 228a and the second outlet switching valve 228b can collectively be referred to as outlet switching valves 228.

The first inlet switching valve 226a is coupled between the first storage node 210a and each of the CDUs 220. In particular, the first inlet switching valve 226a is coupled between the first storage node 210a and the first inlet manifold 222a. The second inlet switching valve 226a is coupled between the second storage node 210b and each of the CDUs 220. In particular, the second inlet switching valve 226b is coupled between the second storage node 210b and the second inlet manifold 222b. The inlet switching valves 226 can be connected between the storage nodes 210 and the inlet manifolds 222 via inlet tubing/piping.

The first outlet switching valve 228a is coupled between the first storage node 210a and each of the CDUs 220. In particular, the first outlet switching valve 228 is coupled between the first storage node 210a and the first outlet manifold 224a. The second outlet switching valve 228b is coupled between the second storage node 210b and each of the CDUs 220. In particular, the second outlet switching valve 228 is coupled between the second storage node 210b and the second outlet manifold 224b. The outlet switching valves 228 can be connected between the storage nodes 210 and the outlet manifolds 224 via outlet tubing/piping.

The inlet switching valves 226 and the outlet switching valves 228 can each be a 4-position, 3-way/port directional valve (directional valve switching mechanism).

The first CDU 220a can include a sensor 230a, and the second CDU 220b can include a sensor 230b (collectively referred to as sensors 230). The sensors 230 can detect failure of cooling with respect to the cooling loops (CDUs 220, inlet manifolds 222, outlet manifolds 224, inlet switching valves 226, outlet switching valves 228, or tubing/piping thereof). The sensors 230 can be in communication with the controller computing module 206.

During normal (nominal) operating conditions, the cooling loops provide necessary/appropriate cooling to the storage rack 208, and in particular, the storage nodes 210. In short, the inlet switching valves 226 can combine redundant liquid loops from the inlet manifolds 222 and the CDUs 220 to provide 100% cooling capacity continuously to each of the storage nodes 210, and in particular, in the event of a failure of any part of the cooling loop. That is, the cooling loops provide high availability (HA) in any single point failure/service without shutdown of the storage rack 208.

In some examples, each of the cooling loops can resolve 100% of the cooling needs of the storage rack 208 (e.g., two loops 1+1 redundancy). That is, the first cooling loop (the first CDU 220a, the first inlet manifold 222a, the first outlet manifold 224a, the first inlet switching valves 226, and the first outlet switching valves 228) or the second cooling loop (the second CDU 220b, the second inlet manifold 222b, the second outlet manifold 224b, the first inlet switching valves 226, and the first outlet switching valves 228) can each provide 100% of the cooling needs of the storage rack 208. Thus, only one of the cooling loops is implemented at a time.

In some examples, each of the cooling loops can resolve 50% of the cooling needs of the storage rack 208. That is, the combination of the two cooling loops can provide 100% of the cooling needs of the storage rack 208. For example, the first cooling loop (the first CDU 220a, the first inlet manifold 222a, the first outlet manifold 224a, the first inlet switching valves 226, and the first outlet switching valves 228) can provide 50% of the cooling needs of the storage rack 208; and the second cooling loop (the second CDU 220b, the second inlet manifold 222b, the second outlet manifold 224b, the first inlet switching valves 226, and the first outlet switching valves 228) can provide 50% of the cooling needs of the storage rack 208. Thus, when combined, the two cooling loops can provide 100% of the cooling needs of the storage rack 208. Thus, both cooling loops can be implemented simultaneously/concurrently.

In some implementations, one or more of the cooling loops can experience a failure. For example, the first CDU 220a, the first inlet manifold 222a, and/or the first outlet manifold 224a (and/or associated tubing/piping) can experience a failure. The first CDU 220a, the first inlet manifold 222a, and/or the first outlet manifold 224a can experience a failure such as leaking (CDU internal leaking, manifold leaking), and/or leaking by the associated tubing/piping.

When the first cooling loop experiences a failure, a state of the inlet switches 226a, 226b are adjusted to i) prevent the first CDU 220a from providing cooling of the first storage node 210a and the second storage node 210b and ii) allow only the second CDU 220b (and the second cooling loop) to provide cooling of the first storage node 210a and the second storage node 210b. Furthermore, when the first cooling loop experiences a failure, a state of the outlet switches 228a, 228b are adjusted to i) further prevent the first CDU 220a from providing cooling of the first storage node 210a and the second storage node 210b and ii) allow only the second CDU 220b (and the second cooling loop) to provide cooling of the first storage node 210a and the second storage node 210b. The second cooling loop provides 100% of the cooling capacity for the storage nodes 210 when the first cooling loop experiences the failure.

Specifically, the sensor 230a of the first CDU 220a can identify/determine/calculate a failure of the first cooling loop (the first CDU 220a, the first inlet manifold 222a, and/or the first outlet manifold 224a (and/or associated tubing/piping)). In some examples, the sensor 230a can detect a leaking of cooling fluid of the first cooling loop. The sensor 230a can provide a signal to the controller computing module 206 indicating such detected failure. The controller computing module 206 can provide a signal to the inlet switching valves 226a, 226b and the outlet switching valves 228a, 228b to adjust the respective state thereof.

In some examples, prior to failure (when the first cooling loop is nominal), only the first cooling loop can provide cooling to the storage nodes 210, as described previously (e.g., 1+1 redundancy). That is, the state of the first inlet switch 226a and the state of the second inlet switch 226b allows only the first CDU 220a to provide cooling of the CDUs 220. For example, when the inlet switching valves 226a, 226b include 3-position 4-way/port directional valves, the valves can provide a connection to only the first cooling loop (the first CDU 220a, the first inlet manifold 222a); and when the when the outlet switching valves 228a, 228b include 3-position 4-way/port directional valves, the valves can provide a connection to only the first cooling loop (the first CDU 220a, the first outlet manifold 224a).

In some examples, when the first cooling loop experiences such a failure, only the second cooling loop provides cooling for the storage nodes 210 and ensures 100% cooling performance. Specifically, the controller computing module 206 can provide a signal to the inlet switching valves 226a, 226b and the outlet switching valves 228ba 228b to change a state thereof such that the first CDU 220a is disabled from providing cooling to the storage nodes 210 (disabled from moving cooling fluid within the first cooling loop); and only the second CDU 220b is able to provide cooling to the storage nodes 210 (enabled to move cooling fluid within the second cooling loop). For example, when the inlet switching valves 226a, 226b include 3-position 4-way/port directional valves, the valves can switch a connection from the first cooling loop (the first CDU 220a, the first inlet manifold 222a) to the second cooling loop (the second CDU 220b, the second inlet manifold 222b). For example, when the outlet switching valves 228a, 228b include 3-position 4-way/port directional valves, the valves can switch a connection from the first cooling loop (the first CDU 220a, the first outlet manifold 224*a*) to the second cooling loop (the second CDU 220*b*, the second outlet manifold 224*b*).

In some examples, prior to failure (when the first cooling loop is nominal), the first cooling loop and the second cooling loop can both provide cooling of the storage nodes 210 and ensures 100% cooling performance. For example, each of the cooling loops provides 50% of the cooling performance such that the combination of the first cooling loop and the second cooling loop provides 100% cooling performance. That is, that state of the first inlet switch 226*a* and the state of the second inlet switch 226*b* allows the first CDU 220*a* and the second CDU 220*b* to provide cooling of the first storage node 210*a* and the second storage node 210*b*. That is, each of the first CDU 220*a* and the second CDU 220*b* provides 50% of the cooling of each of the storage nodes 210. For example, when the inlet switching valves 226*a*, 226*b* include 3-position 4-way/port directional valves, the valves can provide a connection to both the first cooling loop (the first CDU 220*a*, the first inlet manifold 222*a*) and the second cooling loop (the second CDU 220*b*, the second inlet manifold 222*b*); and when outlet switching valves 228*a*, 228*b* include 3-position 4-way/port directional valves, the valves can provide a connection to both the first cooling loop (the first CDU 220*a*, the first outlet manifold 224*a*) and the second cooling loop (the second CDU 220*b*, the second outlet manifold 224*b*).

In some examples, when the first cooling loop experiences such a failure, only the second cooling loop provides cooling for the storage nodes 210 and ensures at least 50% cooling performance, and up to 100% cooling performance based power usage at the storage nodes 210 and an environment of the storage nodes 210. Specifically, the controller computing module 206 can provide a signal to the inlet switching valves 226*a*, 226*b* and the outlet switching valves 228*a* 228*b* to change a state thereof such that the first CDU 220*a* is disabled from providing cooling to the storage nodes 210 (disabled from moving cooling fluid within the first cooling loop); and only the second CDU 220*b* is able to provide cooling to the storage nodes 210 (enabled to move cooling fluid within the second cooling loop). For example, when the inlet switching valves 226*a*, 226*b* include 3-position 4-way/port directional valves, the valves can switch a connection from the first cooling loop (the first CDU 220*a*, the first inlet manifold 222*a*) to the second cooling loop (the second CDU 220*b*, the second inlet manifold 222*b*). For example, when the outlet switching valves 228*a*, 228*b* include 3-position 4-way/port directional valves, the valves can switch a connection within the vales from the first cooling loop (the first CDU 220*a*, the first outlet manifold 224*a*) to the second cooling loop (the second CDU 220*b*, the second inlet manifold 222*b*).

In some examples, one of the storage nodes 210 can experience a failure. For example, the storage node 210*a*, the first inlet switching valve 226*a*, and/or the first outlet switching valve 228*a* (and/or associated tubing/piping) can experience a failure. For example, the storage node 210*a* may have an associated coolant leak, and/or a valve may be malfunctioning. The first storage node 210*a* can be isolated such that cooling is only provided to the storage node 210*b*.

When the first storage node 210*a* experiences a failure, a state of the inlet switches 226*a*, 226*b* are adjusted to i) prevent the CDUs 220 from providing cooling of the first storage node 210*a* and ii) allow the CDUs 220 to provide cooling only of the second storage node 210*b*. Furthermore, when the first storage node 210*a* experiences a failure, a state of the outlet switches 228*a*, 228*b* are adjusted to i) further prevent the CDUs 220 from providing cooling of the first storage node 210*a* and ii) allow the CDUs 220 to provide cooling only of the second storage node 210*b*. The first and/or the second cooling loops provide 100% of the cooling capacity for the second storage node 210*b* (and 0% of the cooling capacity for the first storage node 210*a*) when the first storage node 210*a* experiences the failure.

Specifically, the sensor 212*a* of the first storage node 210*a* can identify/determine/calculate a failure of the first CDU 220*a*, the first inlet switch 226*a*, and/or the first outlet switch 228*a* (and/or associated tubing/piping)). In some examples, the sensor 212*a* can detect a leaking of cooling fluid. The sensor 212*a* can provide a signal to the controller computing module 206 indicating such detected failure. The controller computing module 206 can provide a signal to the first inlet switching valve 226*a* and the first outlet switching valve 228*a* to adjust the respective state thereof.

In some examples, prior to failure (when the first cooling loop is nominal), the first cooling loop can provide cooling to the storage nodes 210 solely, or in combination with the second cooling loop. That is, the state of the first inlet switch 226*a* and the state of the second inlet switch 226*b* at least allows the first CDU 220*a* to provide cooling of the storage devices 210. For example, when the inlet switching valves 226*a*, 226*b* include 3-position 4-way/port directional valves, the valves can provide a connection to the first cooling loop (the first CDU 220*a*, the first inlet manifold 222*a*), and in some examples, an additional connection to the second cooling loop (the second CDU 220*b*, the second inlet manifold 222*b*). Further, when the outlet switching valves 228*a*, 228*b* include 3-position 4-way/port directional valves, the valves can provide a connection to the first cooling loop (the first CDU 220*a*, the first outlet manifold 224*a*), and in some examples, an additional connection to the second cooling loop (the second CDU 220*b*, the second outlet manifold 224*b*).

In some examples, when the first storage node 210*a* experiences such a failure, the first storage node 210*a* is isolated such that only cooling is provided to the second storage node 210*b*.

Specifically, the controller computing module 206 can provide a signal to the first inlet switching valve 226*a* and the first outlet switching valves 228*a* to change a state thereof such that the first CDU 220*a* and the second CDU 220*b* is disabled from providing cooling to the first storage node 210*a* (disabled from moving cooling fluid within the first cooling loop and the second cooling loop to the first storage node 210*a*); and first CDU 220*a* and the second CDU 220*b* are only able to provide cooling to the second storage node 210*b* (enabled from moving cooling fluid within the first cooling loop and the second cooling loop to the second storage node 210*b*). For example, when the inlet switching valve 226*a* include 3-position 4-way/port directional valves, the valve can switch a connection such that any cooling fluid is prevented from cooling the first storage node 210*a*. For example, when the inlet switching valve 228*a* include 3-position 4-way/port directional valves, the valve can switch a connection such that any cooling fluid is prevented from cooling the first storage node 210*a*.

FIG. 3 illustrates a flowchart depicting selected elements of an embodiment of a method 300 for providing continuous cooling to a storage rack. The method 300 may be performed by the information handling system 100, the information handling system 202, the environment 200, and/or the controller computing module 206, and with reference to FIGS. 1-2. It is noted that certain operations described in method 300 may be optional or may be rearranged in different embodiments The controller computing module 206 adjusts the state of the first inlet switching valve 226a to allow cooling of the first storage node 210a by the first CDU 220a (302). The controller computing module 206 adjusts the state of the second inlet switching valve 226b to allow cooling of the second storage node 210b by the first CDU (304). In some examples, the controller computing module 206 can adjust the states of the first inlet switching valve 226a and the second inlet switching value 226b simultaneously. In some examples, the controller computing module 206 can adjust the states of the first inlet switching valve 226a and the second inlet switching value 226b sequentially. The first CDU 220a cools the first storage node 210a and the second storage node 210b (306). The controller computing module 206 receives a signal indicating a detected failure of the first CDU 220a (308). The controller computing module 206, in response to the failure of the first CDU 220a, adjusts the state of the first inlet switching valve 226a to prevent cooling of the first storage node 210a and the second storage node 210b by the first CDU 220a (310). Further, this allows cooling of the first storage node 210a and the second storage node 210b by only the second CDU 220b. Only the second CDU 220b cools the first storage node 210a and the second storage node 210b.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system for providing continuous cooling to a storage rack, comprising:
   a storage rack, including a first storage node and a second storage node;
   a first cooling loop including a first cooling distribution unit (CDU);
   a second cooling loop including a second cooling distribution unit (CDU);
   a first inlet switching valve coupled between the first storage node and each of the first and the second CDUs; and
   a second inlet switching valve coupled between the second storage node and each of the first and the second CDUs;
   wherein, when the first cooling loop experiences a failure, a state of the first inlet switch and a state of the second inlet switch is adjusted to i) prevent the first CDU from providing cooling of the first storage node and the second storage node and ii) allow only the second CDU to provide cooling of the first storage node and the second storage node.

2. The system of claim 1, wherein when the first cooling loop is nominal, the state of the first inlet switch and the state of the second inlet switch allows the first CDU and the second CDU to provide cooling of the first storage node and the second storage node.

3. The system of claim 2, wherein each of the first CDU and the second CDU provide 50% of the cooling of each of the first and the second storage nodes.

4. The system of claim 1, wherein when the first cooling loop is nominal, the state of the first inlet switch and the state of the second inlet switch allows only the first CDU to provide cooling of the first storage node and the second storage node.

5. The system of claim 1, the first cooling loop further includes:
   a first outlet switching valve coupled between the first storage node and each of the first and the second CDUs; and
   a second outlet switching valve coupled between the second storage node and each of the first and the second CDUs;
   wherein, when the first cooling loop experiences the failure, a state of the first outlet switch and a state of the second outlet switch is adjusted to i) further prevent the first CDU from providing cooling of the first storage node and the second storage node and ii) allow only the second CDU to provide cooling of the first storage node and the second storage node.

6. The system of claim 5, wherein the first cooling loop further includes a first inlet manifold coupled between the first CDU and each of the first and second inlet switching valves, and further includes a first outlet manifold coupled between the first CDU and each of the first and second outlet switching valves.

7. The system of claim 5, wherein the second cooling loop further includes a second inlet manifold coupled between the second CDU and each of the third and fourth inlet switching valves, and further includes a second outlet manifold coupled between the second CDU and each of the third and fourth outlet switching valves.

8. An information handling system, comprising:
   a storage rack, including a first storage node and a second storage node;
   a first cooling loop including a first cooling distribution unit (CDU);
   a second cooling loop including a second cooling distribution unit (CDU);

a first inlet switching valve coupled between the first storage node and each of the first and the second CDUs;
a second inlet switching valve coupled between the second storage node and each of the first and the second CDUs;
a processor having access to memory media storing instructions executable by the processor to perform operations comprising, comprising:
adjusting i) a state of the first inlet switching valve to allow cooling of the first storage node by the first CDU and ii) a state of a second inlet switching valve to allow cooling of the second storage node by the first CDU;
detecting a failure of the first cooling loop; and
in response to detecting the failure of the first cooling loop, adjusting the state of the first inlet switching valve and the second inlet valve to i) prevent cooling of the first storage node and the second storage node by the first CDU and ii) allowing cooling of the first storage node and the second storage node by only the second CDU.

9. The information handling system of claim 8, wherein when the first cooling loop is nominal, the state of the first inlet switch and the state of the second inlet switch allows the first CDU and the second CDU to provide cooling of the first storage node and the second storage node.

10. The information handling system of claim 9, wherein each of the first CDU and the second CDU provide 50% of the cooling of each of the first and the second storage nodes.

11. The information handling system of claim 8, wherein when the first cooling loop is nominal, the state of the first inlet switch and the state of the second inlet switch allows only the first CDU to provide cooling of the first storage node and the second storage node.

12. The information handling system of claim 8, the first cooling loop further includes:
a first outlet switching valve coupled between the first storage node and each of the first and the second CDUs; and
a second outlet switching valve coupled between the second storage node and each of the first and the second CDUs;
wherein, further in response to detecting the failure of the first cooling loop, a state of the first outlet switch and a state of the second outlet switch is adjusted to i) further prevent the first CDU from providing cooling of the first storage node and the second storage node and ii) allow only the second CDU to provide cooling of the first storage node and the second storage node.

13. The information handling system of claim 12, wherein the first cooling loop further includes a first inlet manifold coupled between the first CDU and each of the first and second inlet switching valves, and further includes a first outlet manifold coupled between the first CDU and each of the first and second outlet switching valves.

14. The information handling system of claim 12, wherein the second cooling loop further includes a second inlet manifold coupled between the second CDU and each of the third and fourth inlet switching valves, and further includes a second outlet manifold coupled between the second CDU and each of the third and fourth outlet switching valves.

15. A computer-implemented method, comprising:
adjusting i) a state of a first inlet switching valve coupled between a first storage node and each of a first cooling distribution unit (CDU) and a second cooling distribution unit (CDU) to allow cooling of the first storage node by the first CDU and ii) a state of a second inlet switching valve coupled between the second storage node and each of the first CDU and the second CDU to allow cooling of the second storage node by the first CDU;
after adjusting the states of the first and the second inlet switching valves, cooling of the first storage node and the second storage node by the first CDU;
detecting a failure of the first cooling lop;
in response to detecting the failure of the first cooling loop:
adjusting the state of the first inlet switching valve and the second inlet valve to i) prevent cooling of the first storage node and the second storage node by the first CDU and ii) allowing cooling of the first storage node and the second storage node by only the second CDU; and
cooling of the first storage node and the second storage node only by the second CDU.

16. The computer-implemented method of claim 15, further comprising:
detecting that the first cooling loop is nominal, and in response, adjusting the state of the first inlet switch and the state of the second inlet switch to allow the first CDU and the second CDU to provide cooling of the first storage node and the second storage node.

17. The computer-implemented method of claim 16, wherein each of the first CDU and the second CDU provide 50% of the cooling of each of the first and the second storage nodes.

18. The computer-implemented method of claim 15, further comprising:
detecting that the first cooling loop is nominal, and in response, adjusting the state of the first inlet switch and the state of the second inlet switch to allow only the first CDU to provide cooling of the first storage node and the second storage node.

19. The computer-implemented method of claim 15, further comprising:
adjusting a state of a first outlet switch coupled between the first storage node and each of the first and the second CDUs and a state of a second outlet switch coupled between the second storage node and each of the first and the second CDUs to i) prevent the first CDU from providing cooling of the first storage node and the second storage node and ii) allow only the second CDU to provide cooling of the first storage node and the second storage node.

20. The computer-implemented method of claim 19, wherein the second CDU provides 100% of the cooling of the first storage node and the second storage node.

* * * * *